(12) United States Patent
Jun

(10) Patent No.: US 9,660,005 B2
(45) Date of Patent: May 23, 2017

(54) DISPLAY DEVICE

(71) Applicant: Samsung Display Co., LTD., Yongin-si, Gyeonggi-Do (KR)

(72) Inventor: Woo-Sik Jun, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/042,795

(22) Filed: Feb. 12, 2016

(65) Prior Publication Data

US 2016/0300895 A1    Oct. 13, 2016

(30) Foreign Application Priority Data

Apr. 8, 2015   (KR) .................. 10-2015-0049556

(51) Int. Cl.
| | | |
|---|---|---|
| *H01L 51/52* | (2006.01) | |
| *H01L 27/32* | (2006.01) | |
| *H01L 27/12* | (2006.01) | |

(52) U.S. Cl.
CPC ........ *H01L 27/3246* (2013.01); *H01L 27/124* (2013.01); *H01L 51/5271* (2013.01); *H01L 2251/5307* (2013.01)

(58) Field of Classification Search
CPC .............. H01L 27/3246; H01L 27/124; H01L 2251/5307; H01L 51/5271
See application file for complete search history.

(56) References Cited

U.S. PATENT DOCUMENTS

| | | | |
|---|---|---|---|
| 2011/0205198 A1* | 8/2011 | Jeong | H01L 27/326 345/205 |
| 2016/0020263 A1* | 1/2016 | Xu | H01L 29/423 257/40 |

FOREIGN PATENT DOCUMENTS

| | | | | |
|---|---|---|---|---|
| CN | WO 2015096375 A1 * | 7/2015 | ......... | H01L 29/423 |
| KR | 10-2005-0067804 | 7/2005 | | |
| KR | 10-0636507 | 10/2006 | | |
| KR | 10-2007-0022954 | 2/2007 | | |
| KR | 10-0685844 | 2/2007 | | |
| KR | 10-2009-0116101 | 11/2009 | | |
| KR | 10-2010-0008937 | 1/2010 | | |
| KR | 10-2011-0097046 | 8/2011 | | |
| KR | 10-2012-0050171 | 5/2012 | | |

* cited by examiner

*Primary Examiner* — Donald Raleigh
(74) *Attorney, Agent, or Firm* — Innovation Counsel LLP

(57) ABSTRACT

A display device includes a first substrate, a first light emitting structure, a first transistor, a second transistor, a second light emitting structure, and a second substrate. The first light emitting structure is disposed on the first substrate. The first transistor is disposed on the first light emitting structure, and electrically connected to the first light emitting structure. The second transistor is disposed on the same level with the first transistor. The second light emitting structure is disposed on the first and second transistors, and electrically connected to the second transistor. The second substrate is disposed on the second light emitting structure, and opposite to the first substrate.

20 Claims, 10 Drawing Sheets

DISPLAY DEVICE

CROSS-REFERENCE TO RELATED APPLICATION(S)

This application claims priority under 35 USC §119 to Korean Patent Applications No. 10-2015-0049556, filed on Apr. 8, 2015 in the Korean Intellectual Property Office (KIPO), the contents of which are incorporated herein in its entirety by reference.

BACKGROUND

1. Field

Example embodiments relate generally to electronic devices. More particularly, embodiments of the present inventive concept relate to display devices.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby light of a certain wavelength can be emitted.

Recently, as light emitting layers are disposed on each of lower and upper surfaces of the display device, a dual display device (e.g., double sided emission display device) capable of displaying a display image in both sides surfaces (e.g., the front and rear directions) has been developed. For example, a thickness of the dual display device that two display devices are combined may become larger. On the other hand, in one pixel included in the dual display device, one portion of the pixel may emit light in a first direction (e.g., the front), and the other portions of the pixel may emit light in a second direction (e.g., the rear). In this case, an opening ratio of the dual display device may be reduced.

SUMMARY

Some example embodiments provide a double sided emission display device including transistors that are disposed at the same level between light emitting structures.

Some example embodiments provide a double sided emission display device including a transparent region.

According to one aspect of example embodiments, a display device includes a first substrate, a first light emitting structure, a first transistor, a second transistor, a second light emitting structure, and a second substrate. The first light emitting structure is disposed on the first substrate. The first transistor is disposed on the first light emitting structure, and electrically connected to the first light emitting structure. The second transistor is disposed on the same level with the first transistor. The second light emitting structure is disposed on the first and second transistors, and electrically connected to the second transistor. The second substrate is disposed on the second light emitting structure, and opposite to the first substrate.

In example embodiments, the first light emitting structure may include a first electrode on the first substrate, a first light emitting layer on the first electrode, and a second electrode on the first light emitting layer.

In example embodiments, the display device may further include a first pixel defining layer exposing a portion of the first electrode and electrically insulating the first and second electrodes.

In example embodiments, the first light emitting layer may include at least one selected from a small molecule organic light emitting layer, a polymer organic light emitting layer, an inorganic light emitting layer.

In example embodiments, light that is emitted from the first light emitting layer may be reflected from the second electrode, and may transmit the first electrode.

In example embodiments, the second light emitting structure may include a third electrode on the first and second transistors, a second light emitting layer on the third electrode, and a fourth electrode on the second light emitting layer.

In example embodiments, the display device may further include a protection layer on the first and second transistors, and the third electrode may contact to the second transistor through a contact hole formed in a portion of the protection layer.

In example embodiments, the display device may further include a second pixel defining layer exposing a portion of the third electrode and electrically insulating the third and fourth electrodes.

In example embodiments, light that is emitted from the second light emitting layer may be reflected from the third electrode, and may transmit the fourth electrode.

In example embodiments, the first transistor may include a first active pattern on the first light emitting structure, a first gate electrode on the first active pattern, a first source electrode electrically connected to a source region of the first active pattern, and a first drain electrode electrically connected to a drain region of the first active pattern and the first light emitting structure.

In example embodiments, the second transistor may include a second active pattern disposed on the same level with the first active pattern and spaced apart from the first active pattern, a second gate electrode disposed on the same level with the first gate electrode and spaced apart from the first gate electrode, a second source electrode electrically connected to a source region of the second active pattern, and a second drain electrode electrically connected to a drain region of the second active pattern and the second light emitting structure.

In example embodiments, the display device may further include a planarization layer between the first light emitting structure and the first and second transistors, a gate insulating layer covering the first and second active patterns on the planarization layer, and an insulating interlayer covering the first and second gate electrodes on the gate insulating layer.

In example embodiments, the first drain electrode may include a first extension portion covering a surface of the insulating interlayer, a second extension portion extending from the first extension portion in a direction that is perpendicular to the upper surface of the first substrate, the second extension portion contacting the drain region of the first active pattern through a contact hole formed in a portion of the gate insulating layer and a portion of the insulating interlayer, and a third extension portion spaced apart from the second extension portion, the third extension portion extending from the first extension portion in a direction that is perpendicular to the upper surface of the first substrate, the third extension portion contacting the first light emitting structure through a contact hole formed in a portion of the gate insulating layer, a portion of the insulating interlayer and a portion of the first planarization layer.

In example embodiments, the second drain electrode may include a fourth extension portion covering a surface of the insulating interlayer, and a fifth extension portion extending from the fourth extension portion in a direction that is perpendicular to the upper surface of the first substrate, the fifth extension portion contacting the drain region of the second active pattern through a contact hole formed in a portion of the gate insulating layer and a portion of the insulating interlayer.

In example embodiments, the first source electrode may contact the source region of the first active pattern through a contact hole formed in a portion of the gate insulating layer and a portion of the insulating interlayer, and the second source electrode may contact the source region of the second active through a contact hole formed in a portion of the gate insulating layer and a portion of the insulating interlayer.

In example embodiments, the first light emitting structure may display a first display image in a first direction that is perpendicular to an upper surface of the first substrate, and the second light emitting structure may display a second display image in a second direction that is opposite to the first direction.

In example embodiments, the first display image may be the same as the second display image.

In example embodiments, the first display image may be different from the second display image.

In example embodiments, the first substrate may have a display region and a transparent region.

In example embodiments, the first light emitting structure, a second light emitting structure, a first transistor, and a second transistor may be disposed in the display region, and an image of an object that is located in the rear of the display device may be transmitted through the transparent region.

As a display device according to example embodiments includes transistors disposed on the same level between light emitting structures, a thickness of the display device may be reduced. In addition, an opening ratio of the display device may be increased because a light emitting layer is not emitted in the front and the rear of the display device by dividing light emitting layer. Further, since each of light emitting structures may be electrically connected to each of the transistors, the display device may serve a double-sided emission display device capable of simultaneously displaying the same display image in lower and upper surfaces of the display device, or simultaneously displaying the different display image in the lower and upper surfaces of the display device.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Hereinafter, embodiments of the present inventive concept will be explained in detail with reference to the accompanying drawings.

Figure 1:
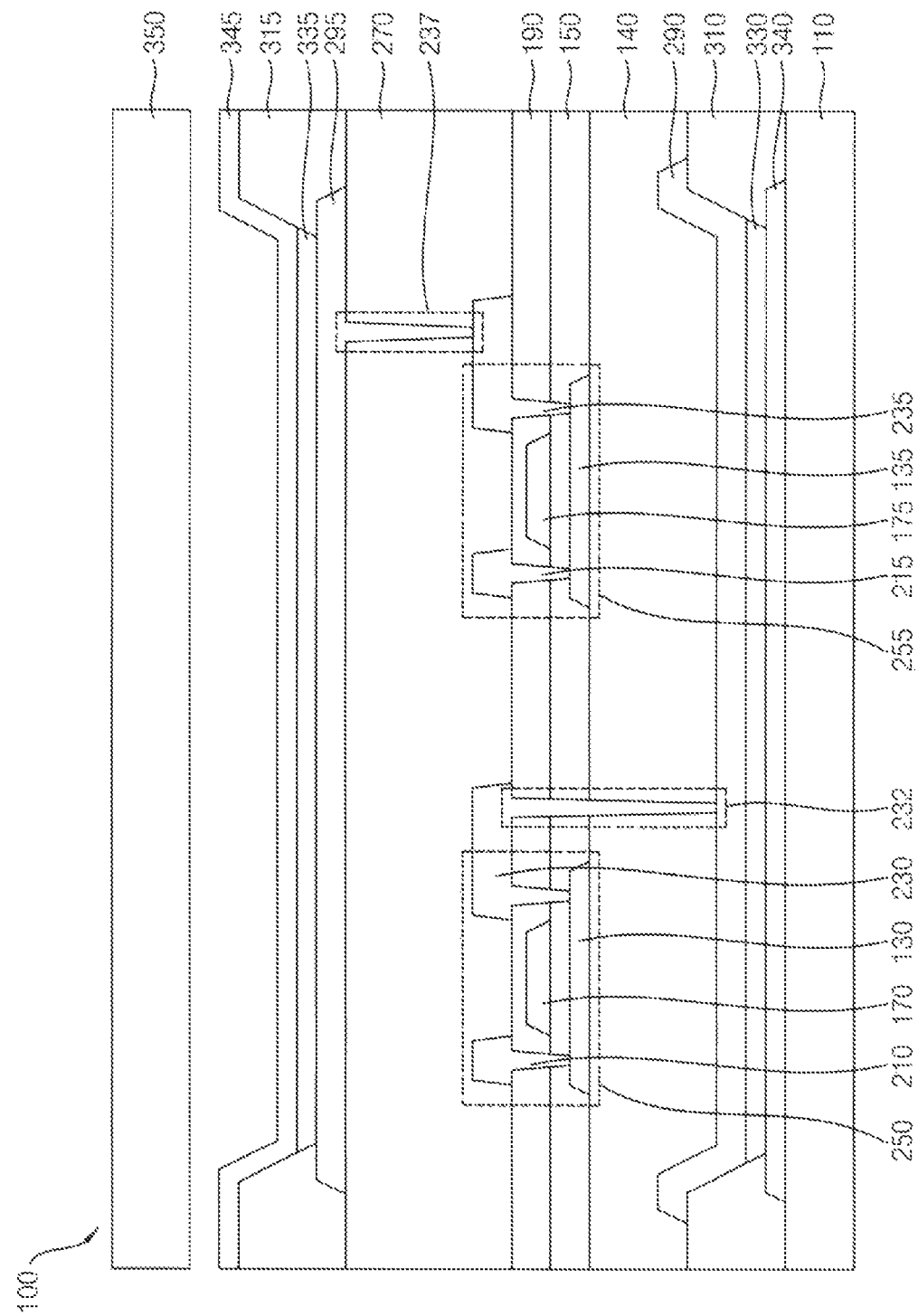
FIG. 1 is a cross-sectional view illustrating a display device in accordance with example embodiments.

FIG. 1 is a cross-sectional view illustrating a display device in accordance with example embodiments.

Referring to FIG. 1, a display device 100 may include a first substrate 110, a first light emitting structure, a first pixel defining layer 310, a planarization layer 140, a gate insulating layer 150, an insulating interlayer 190, a first transistor 250, a second transistor 255, a protection layer 270, a second light emitting structure, a second pixel defining layer 315, a second substrate 350, etc. Here, the first light emitting structure may include a first electrode 340, a first light emitting layer 330, and a second electrode 290. The second light emitting structure may include a third electrode 295, a second light emitting layer 335, and a fourth electrode 345. In addition, each of the first and second transistors 250 and 255 may include first and second active patterns 130 and 135, first and second gate electrodes 170 and 175, first and second source electrodes 210 and 215, and first and second drain electrodes 230 and 235.

For example, as the display device 100 includes the first light emitting layer 330 that is electrically connected to the first transistor 250 and the second light emitting layer 335 that is electrically connected to the second transistor 255, the display device 100 may serve as a double-sided emission display device (e.g., dual display device) capable of simultaneously (e.g., concurrently) emitting light in an upper surface (e.g., the front) and a lower surface (e.g., the rear). In addition, the display device 100 may serve as the double-sided emission display device capable of displaying different display images in the front and the rear.

The first light emitting structure may be disposed on the first substrate 110. The first substrate 110 may be formed of transparent materials. For example, the first substrate 110 may include a quartz substrate, a synthetic quartz substrate, a calcium fluoride substrate, a fluoride-doping quartz substrate, a sodalime substrate, a non-alkali substrate etc. Alternatively, the first substrate 110 may be formed of a flexible transparent material such as a flexible transparent resin substrate.

For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of the first and second light emitting structures during a manufacturing process. That is, the first substrate 110 may have a structure in which the first polyimide layer, the barrier film layer and the second polyimide layer are stacked on the rigid glass substrate. In a manufacturing the display device 100, after an insulation layer is provided on the second polyimide layer of the polyimide substrate, the first and second light emitting structures may be disposed on the insulation layer. After the first and second light emitting structures are formed on the insulation layer, the rigid glass substrate under which the polyimide substrate is disposed may be removed. It may be difficult to directly form the first and second light emitting structures on the polyimide substrate because the polyimide substrate is relatively thin and flexible. Accordingly, the first and second light emitting structures are formed on the polyimide substrate disposed on the rigid glass substrate, and then the polyimide substrate may serve as the first substrate 110 of the display device 100 after the removal of the rigid glass substrate.

A buffer layer (not shown) may be disposed on the first substrate 110. The buffer layer may be formed on an entire surface of the first substrate 110. The buffer layer may prevent the diffusion of metal atoms and/or impurities from the first substrate 110. Additionally, the buffer layer may control a rate of a heat transfer in a crystallization process for forming the first and second active patterns 130 and 135, thereby obtaining substantially uniform active patterns, the first and second active patterns 130 and 135. Furthermore, the buffer layer may improve a surface flatness of the first substrate 110 when a surface of the first substrate 110 is relatively uneven. According to a type of the first substrate 110, at least two buffer layers may be provided on the first substrate 110, or the buffer layer may not be disposed.

The first electrode 340 may be disposed on the first substrate 110. A thickness of the first electrode 340 may be relatively thinner than that of the second electrode 290. For example, the thickness of the first electrode 340 may be about 100 angstroms. After a light that is emitted from the first light emitting layer 330 transmits the first electrode 340 having a thin (e.g., low) thickness, the light may be emitted in a lower surface (e.g., the rear) of the display device 100. In some example embodiments, the first electrode 340 may be disposed on the entire first substrate 110. The first electrode 340 may be formed of a metal, a metal alloy, metal nitride, conductive metal oxide, transparent conductive materials, etc. For example, the first electrode 340 may include aluminum (Al), an alloy of aluminum, aluminum nitride (AlNx), silver (Ag), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof.

The first pixel defining layer 310 may be disposed on the first substrate 110 to expose at least a portion of the first electrode 340. In this case, the first light emitting layer 330 may be disposed on a portion where at least a portion of the first electrode 340 is exposed by the first pixel defining layer 310. The first pixel defining layer 310 may electrically insulate the first electrode 340 and the second electrode 290. For example, the first pixel defining layer 310 may include an organic material, an inorganic material, etc.

The first light emitting layer 330 may be disposed on the first electrode 340, and may be surrounded by the first pixel defining layer 310. The first light emitting layer 330 may be formed of at least one of light emitting materials capable of generating different colors of light (e.g., a red color of light, a blue color of light, and a green color of light, etc) according to a configuration of the display device 100. In example embodiments, the first light emitting layer 330 may include at least one selected from a small molecule organic light emitting layer, a polymer organic light emitting layer, an inorganic light emitting layer. For example, when the first light emitting layer 330 is disposed using the low molecule organic light emitting layer, the first light emitting layer 330 may be disposed in a vacuum condition by using a vacuum thermal evaporation method or a vapor phase deposition method. The low molecule organic light emitting layer may include host materials and dopant materials. The host materials may be formed of tris (8-hydroxyquinolate) aluminium (Alq3) or 4,4'-N,N'-dicarbazole-biphenyl (CBP), etc. The dopant materials may be formed of platinum (Pt), iridium (Ir), gold (Au), etc.

In contrast, the first light emitting layer 330 may be disposed using the polymer organic light emitting layer. The polymer organic light emitting layer may be disposed in an atmospheric condition by using an ink jet printing method, a spin coating method, a laser thermal transfer method. For example, the polymer organic light emitting layer may be formed of polyfluorene, polyphenylene, polyphenylene vinylene, polythiophene, polyquinoline, polypyrrole, polyacetylene, spiro fluorene, cyclopenta phenanthrene, polyarylene, etc.

In addition, the first light emitting layer 330 is disposed using the inorganic light emitting layer. The inorganic light emitting layer may be disposed in the atmospheric condition. Compared to the organic light emitting layer, the inorganic light emitting layer may have an advantage that is not degraded even though the inorganic light emitting layer is exposed to water or moisture. Accordingly, a seal process of the display device 100 may be omitted. In addition, since the inorganic light emitting layer has enough thermal resistance, the light emitting structures may be continuously (e.g., sequentially) stacked on the inorganic light emitting layer after the inorganic light emitting layer is disposed on the first substrate 110. For example, the inorganic light emitting layer may be formed of Barium (Ba), calcium (Ca), Copernicium (Cn), gallium (Ga), strontium (Sr), yttrium (Y), zinc (Zn), Sulfur (S), bismuth (Bi), cerium (Ce), chlorine (Cl), chromium (Cr), cobalt (Co), Erbium (Er), Europium (Eu), calcium (K), Terbium (Tb), thulium (Tm), etc. These may be used alone or in a suitable combination thereof.

That is, in a process of manufacturing the first light emitting layer 330 of the display device 100, the first light emitting layer 330 of the display device 100 may be disposed using the small molecule organic light emitting layer, the polymer organic light emitting layer, or the inorganic light emitting layer according to a manufacturing environment. Alternately, the first light emitting layer 330 may generally generate a white color of light by stacking a plurality of light emitting materials capable of generating different colors of light such as a red color of light, a green color of light, a blue color of light, etc.

The second electrode 290 may be disposed on the first light emitting layer 330 and the first pixel defining layer 310. A thickness of the second electrode 290 may be relatively thicker than that of the first electrode 340. For example, the thickness of the second electrode 290 may be over about 500 angstroms. The second electrode 290 having a thick (e.g., high) thickness may reflect light that is emitted from the first light emitting layer 330. That is, after the reflected light transmits the first electrode 340, the light may be emitted in a lower surface of the display device 100. The second electrode 290 may include a metal, a metal alloy, metal nitride, conductive metal oxide, etc. For example, the second electrode 290 may be formed of Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, etc. These may be used alone or in a suitable combination thereof. Accordingly, the first light emitting structure including the first electrode 340, the first light emitting layer 330, and the second electrode 290 may be formed on the first substrate 110.

The planarization layer 140 may be disposed on the second electrode 290 and the first pixel defining layer 310. An upper surface of the planarization layer 140 may have a substantially flat surface. For example, the planarization layer 140 may include inorganic materials or organic materials. The inorganic materials may be formed of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zinc oxide (ZnOx), titanium oxide (TiOx), etc. The organic materials may be formed of polyimide, polyester, acryl, etc. In some example embodiments, the planarization layer 140 may have a stack structure in which the inorganic material and the organic material are alternately stacked.

The first transistor 250 and the second transistor 255 may be disposed on the planarization layer 140. As described above, each of the first and second transistors 250 and 255 may include the first and second active patterns 130 and 135, the first and second gate electrodes 170 and 175, the first and second source electrodes 210 and 215, and the first and second drain electrodes 230 and 235. For example, the first and second active patterns 130 and 135 may be spaced apart from each other by a predetermined distance on the planarization layer 140. Each of the first and second active patterns 130 and 135 may be formed of an oxide semiconductor, an inorganic semiconductor (e.g., amorphous silicon, polysilicon, etc.), an organic semiconductor, etc.

The gate insulating layer 150 may be disposed on the first and second active patterns 130 and 135. The gate insulating layer 150 may cover the first and second active patterns 130 and 135, and may cover the upper surface of the first substrate 110. That is, the gate insulating layer 150 may be disposed on the entire planarization layer 140. The gate insulating layer 150 may include a silicon compound, a metal oxide, etc. In example embodiments, the gate insulating layer 150 may sufficiently cover the first and second active patterns 130 and 135. The gate insulating layer 150 may have a substantially flat surface without a step around the first and second active patterns 130 and 135. Alternatively, the gate insulating layer 150 may cover the first and second active patterns 130 and 135, and may be disposed as a substantially uniform thickness along a profile of the first and second active patterns 130 and 135.

Each of the first and second gate electrodes 170 and 175 may be disposed on the first and second active patterns 130 and 135, respectively, to overlap the first and second active patterns 130 and 135. Each of the first and second gate electrodes 170 and 175 may include a metal, a metal alloy, metal nitride, conductive metal oxide, etc.

The insulating interlayer 190 may be disposed on the first and second gate electrodes 170 and 175. The insulating interlayer 190 may cover the first and second gate electrodes 170 and 175, and the upper surface of the first substrate 110. That is, the insulating interlayer 190 may be disposed on the entire gate insulating layer 150. The insulating interlayer 190 may include a silicon compound, a metal oxide, etc. In example embodiments, the insulating interlayer 190 may sufficiently cover the first and second gate electrodes 170 and 175. The insulating interlayer 190 may have a substantially flat surface without a step around the first and second gate electrodes 170 and 175. Alternatively, the insulating interlayer 190 may cover the first and second gate electrodes 170 and 175, and may be disposed as a substantially uniform thickness along a profile of the first and second gate electrodes 170 and 175.

The first and second source electrodes 210 and 215 and the first and second drain electrodes 230 and 235 may be disposed on the insulating interlayer 190. The first source electrode 210 may contact a source region of the first active pattern 130 through a contact hole formed in a portion of the gate insulating layer 150 and a portion of the insulating interlayer 190, and the second source electrode 215 may contact a source region of the second active pattern 135 through a contact hole formed in a portion of the gate insulating layer 150 and a portion of the insulating interlayer 190. In similar, the first drain electrode 230 may contact a drain region of the first active pattern 130 through a contact hole formed in the gate insulating layer 150 and a portion of the insulating interlayer 190, and the second drain electrode 235 may contact a drain region of the second active pattern 135 through a contact hole formed in the gate insulating layer 150 and a portion of the insulating interlayer 190.

The first drain electrode 230 may have a first extension portion, a second extension portion, and a third extension portion 232. The first extension portion of the first drain electrode 230 may extend on a surface of the insulating interlayer 190. The second extension portion of the first drain electrode 230 may extend from the first extension portion in a direction that is perpendicular to the upper surface of the first substrate 110. For example, the second extension portion may contact the drain region of the first active pattern 130 through a contact hole formed in the gate insulating layer 150 and a portion of the insulating interlayer 190. The third extension portion 232 of the first drain electrode 230 may extend from the first extension portion in a direction that is perpendicular to the upper surface of the first substrate 110. The third extension portion 232 may be spaced apart from the second extension portion. For example, the third extension portion 232 may contact the second electrode 290 through a contact hole formed in the gate insulating layer 150, a portion of the insulating interlayer 190, and a portion of the planarization layer 140. That is, the first transistor 250 may be electrically connected to the first light emitting structure via the third extension portion 232.

The second drain electrode 235 may have a fourth extension portion and a fifth extension portion. The fourth extension portion of the second drain electrode 235 may extend on the surface of the insulating interlayer 190. The fourth extension portion may contact the third electrode 295 that will be described below. The fifth extension portion of the second drain electrode 235 may extend from the fourth extension portion in a direction that is perpendicular to the upper surface of the first substrate 110. For example, the fifth extension portion may contact the drain region of the second active pattern 135 through a contact hole formed in the gate insulating layer 150 and a portion of the insulating interlayer 190. That is, the second transistor 255 may be electrically connected to the second light emitting structure via an extension portion 237 of the third electrode 295.

Each of the first and second source electrodes 210 and 215 and each of the first and second drain electrodes 230 and 235 may include a metal, a metal alloy, metal nitride, conductive metal oxide, etc.

As described above, the first transistor 250 including the first active pattern 130, the first gate electrode 170, the first source electrode 210, and the first drain electrode 230 may be formed on the planarization layer 140. The second transistor 255 including the second active pattern 135, the second gate electrode 175, the second source electrode 215, and the second drain electrode 235 may be formed on the planarization layer 140. Here, the first transistor 250 and the second transistor 255 may be disposed at the same level, may be interposed between the first light emitting structure and the second light emitting structure. Accordingly, a thickness of the display device 100 may be relatively reduced. In addition, the first light emitting structure may be electrically connected to the first transistor 250, and the second light emitting structure may be electrically connected to the second transistor 255. Accordingly, the first light emitting structure may display the first display image in a lower surface (e.g., a first direction) of the display device 100, and the second light emitting structure may display the second display image in an upper surface (e.g., a second direction) of the display device 100. Here, the first display image may be the same as the second display image. Alternatively, the first display image may be different from the second display image.

The protection layer 270 may be disposed on the first and second source electrodes 210 and 215 and the first and second drain electrodes 230 and 235. An upper surface of the protection layer 270 may have a substantially flat surface. The protection layer 270 may cover the first and second source electrodes 210 and 215 and the first and second drain electrodes 230 and 235, and may cover the insulating interlayer 190. That is, the protection layer 270 may be disposed on the entire insulating interlayer 190. For example, the protection layer 270 may include inorganic materials such as SiOx, SiNx, SiOxNy, SiOxCy, SiCxNy, AlOx, AlNx, TaOx, HfOx, ZnOx, TiOx, etc. Alternatively, the protection layer 270 may include organic materials such as polyimide, polyester, acryl, etc. In some example embodiments, the protection layer 270 may have a stack structure in which the inorganic material and the organic material are alternately stacked.

The third electrode 295 may be disposed on the protection layer 270. A thickness of the third electrode 295 may be relatively thicker than that of the fourth electrode 345. For example, the thickness of the third electrode 295 may be over about 500 angstroms. The third electrode 295 having a thick thickness may reflect light that is emitted from the second light emitting layer 335. That is, after the reflected light transmits the fourth electrode 345, the light may be emitted in an upper surface of the display device 100. The third electrode 295 may include a metal, a metal alloy, metal nitride, conductive metal oxide, etc. As described above, the extension portion 237 of the third electrode 295 may contact the second drain electrode 235 through a contact hole formed in the protection layer 270. Accordingly, the second light emitting structure may be electrically connected to the second transistor 255.

The second pixel defining layer 315 may be disposed on the protection layer 270 to expose at least a portion of the third electrode 295. In this case, the second light emitting layer 335 may be disposed on a portion where at least a portion of the third electrode 295 is exposed by the second pixel defining layer 315. The second pixel defining layer 315 may electrically insulate the third electrode 295 and the fourth electrode 345. For example, the second pixel defining layer 315 may be formed of an organic material, an inorganic material, etc.

The second light emitting layer 335 may be disposed on the third electrode 295, and may be surrounded by the second pixel defining layer 315. The second light emitting layer 335 may be formed using at least one of light emitting materials capable of generating different colors of light (e.g., a red color of light, a blue color of light, and a green color of light, etc) according to a configuration of the display device 100. Alternately, the second light emitting layer 335 may generally generate a white color of light by stacking a plurality of light emitting materials capable of generating different colors of light such as a red color of light, a green color of light, a blue color of light, etc.

The fourth electrode 345 may be disposed on the second light emitting layer 335 and the second pixel defining layer 315. A thickness of the fourth electrode 345 may be relatively thinner than that of the third electrode 295. For example, the thickness of the fourth electrode 345 may be about 100 angstroms. After the light that is emitted from the second light emitting layer 335 transmits the fourth electrode 345 having a thin thickness, the light may be emitted in an upper surface (e.g., the front) of the display device 100. In example embodiments, the fourth electrode 345 may be disposed on the entire second light emitting layer 335 and the entire second pixel defining layer 315. Alternatively, the fourth electrode 345 may be disposed on the second light emitting layer 335, and may overlap at least a portion of the second pixel defining layer 315. The fourth electrode 345 may be formed of a metal, a metal alloy, metal nitride, conductive metal oxide, transparent conductive materials, etc. Accordingly, the second light emitting structure including the third electrode 295, the second light emitting layer 335, and the fourth electrode 345 may be formed on the protection layer 270.

The second substrate 350 may be disposed on the fourth electrode 345. The second substrate 350 and the first substrate 110 may include substantially the same materials. For example, the second substrate 350 may be formed of quartz, synthetic quartz, calcium fluoride, fluoride-doping quartz, sodalime glass, non-alkali glass etc. In some example embodiments, the second substrate 350 may be formed of a transparent inorganic material or flexible plastic. For example, the second substrate 350 may include a flexible transparent resin substrate. In this case, to increase flexibility of the display device 100, the second substrate 350 may include a stacked structure where at least one inorganic layer and at least one organic layer are alternately stacked.

As the display device 100 in accordance with example embodiments includes the first and second transistors 250 and 255 located at the same level between the first and second light emitting structures, a thickness of the display device 100 may be reduced. In addition, since the display device 100 includes the first and second light emitting structures, a light emitting layer is not emitted in the front and the rear of the display device 100 by dividing light emitting layer. As a result, an opening ratio of the display device 100 may be increased. Further, the first light emitting structure may be electrically connected to the first transistor 250, and the second light emitting structure may be electrically connected to the second transistor 255. Accordingly, the display device 100 may serve a double-sided emission display device capable of simultaneously displaying the same display image in lower and upper surfaces of the display device 100, or simultaneously displaying the different display image in the lower and upper surfaces of the display device 100.

FIGS. 2 through 9 are cross-sectional views illustrating a method of manufacturing a display device in accordance with example embodiments.

Figure 2:
FIGS. 2, 3, 4, 5, 6, 7, 8 and 9 are cross-sectional views illustrating a method of manufacturing a display device in accordance with example embodiments.

Referring to FIG. 2, a first electrode 740 may be formed on a first substrate 510. The first substrate 510 may be formed using a quartz substrate, a synthetic quartz substrate, a calcium fluoride substrate, a fluoride-doping quartz substrate, a sodalime substrate, a non-alkali substrate etc. Alternatively, a buffer layer may be formed on the first substrate 510. The buffer layer may cover the first substrate 510. That is, the buffer layer may be formed on the entire first substrate 510. The buffer layer may prevent the diffusion of metal atoms and/or impurities from the first substrate 510. A thickness of the first electrode 740 may be formed in about 100 angstroms. For example, the first electrode 740 may be formed such that a transmissivity of the first electrode 740 is over about 80%. The first electrode 740 may be formed of a metal, a metal alloy, metal nitride, conductive metal oxide, transparent conductive materials, etc. For example, the first electrode 740 may be formed using aluminum (Al), an alloy of aluminum, aluminum nitride (AlNx), silver (Ag), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof.

Figure 3:
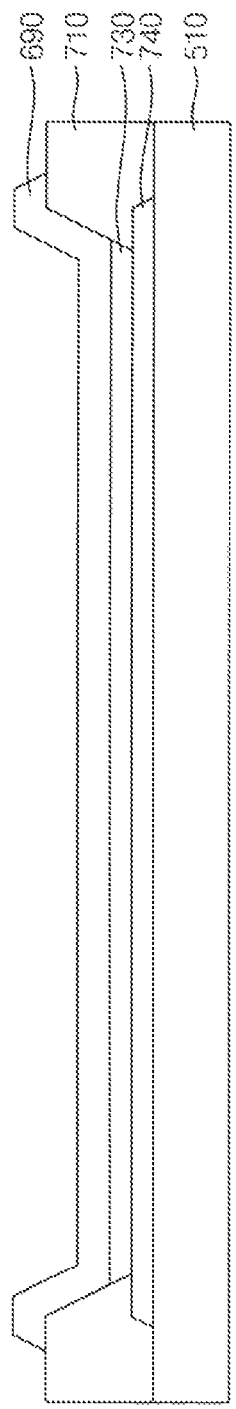

Referring to FIG. 3, a first pixel defining layer 710 may be formed on the first substrate 510 to expose at least a portion of the first electrode 740. For example, the first pixel defining layer 710 may be formed using an organic material, an inorganic material, etc.

A first light emitting layer 730 may be formed on the first electrode 740, and may be surrounded by the first pixel defining layer 710. The first light emitting layer 730 may be formed using at least one of light emitting materials capable of generating different colors of light (e.g., a red color of light, a blue color of light, and a green color of light, etc) according to a configuration of the display device 100. In example embodiments, the first light emitting layer 730 may include at least one selected from a small molecule organic light emitting layer, a polymer organic light emitting layer, an inorganic light emitting layer. For example, when the first light emitting layer 330 is formed using the low molecule organic light emitting layer, the first light emitting layer 730 may be formed in a vacuum condition by using a vacuum thermal evaporation method or a vapor phase deposition method. The low molecule organic light emitting layer may be formed using host materials and dopant materials. The host materials may be formed of tris(8-hydroxyquinolate) aluminium (Alq3) or 4,4'-N,N'-dicarbazole-biphenyl (CBP), etc, and the dopant materials may be formed of platinum (Pt), iridium (Ir), gold (Au), etc.

In contrast, the first light emitting layer 730 is formed using the polymer organic light emitting layer. The polymer organic light emitting layer may be formed in an atmospheric condition by using an ink jet printing method, a spin coating method, a laser thermal transfer method. For example, the polymer organic light emitting layer may be formed using polyfluorene, polyphenylene, polyphenylene vinylene, polythiophene, polyquinoline, polypyrrole, polyacetylene, spiro fluorene, cyclopenta phenanthrene, polyarylene, etc.

In addition, the first light emitting layer 730 is formed using the inorganic light emitting layer. The inorganic light emitting layer may be formed in the atmospheric condition. Compared to the organic light emitting layer, the inorganic light emitting layer may have an advantage that is not degraded, even though the inorganic light emitting layer is exposed to water or moisture. Accordingly, a seal process of a display device may be omitted. In addition, since the inorganic light emitting layer has enough thermal resistance, the light emitting structures may be continuously stacked on the inorganic light emitting layer after the inorganic light emitting layer is formed on the first substrate 510. For example, the inorganic light emitting layer may be formed using Barium (Ba), calcium (Ca), Copernicium (Cn), gallium (Ga), strontium (Sr), yttrium (Y), zinc (Zn), Sulfur (S), bismuth (Bi), cerium (Ce), chlorine (Cl), chromium (Cr), cobalt (Co), Erbium (Er), Europium (Eu), calcium (K), Terbium (Tb), thulium (Tm), etc. These may be used alone or in a suitable combination thereof.

That is, in a process of manufacturing the first light emitting layer 730 of the display device, the first light emitting layer 730 of the display device may be formed using the small molecule organic light emitting layer, the polymer organic light emitting layer, or the inorganic light emitting layer according to a manufacturing environment.

A second electrode 690 may be formed on the first light emitting layer 730 and the first pixel defining layer 710. A thickness of the second electrode 690 may be formed in at least about 500 angstroms. The second electrode 690 having a thick (e.g., high) thickness may reflect light that is emitted from the first light emitting layer 730. That is, after the reflected light transmits the first electrode 740, the light may be emitted in a lower surface of the display device. The second electrode 690 may include a metal, a metal alloy, metal nitride, conductive metal oxide, etc. For example, the second electrode 690 may be formed using Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, etc. These may be used alone or in a suitable combination thereof. Accordingly, a first light emitting structure including the first electrode 740, the first light emitting layer 730, and the second electrode 690 may be formed.

Figure 4:
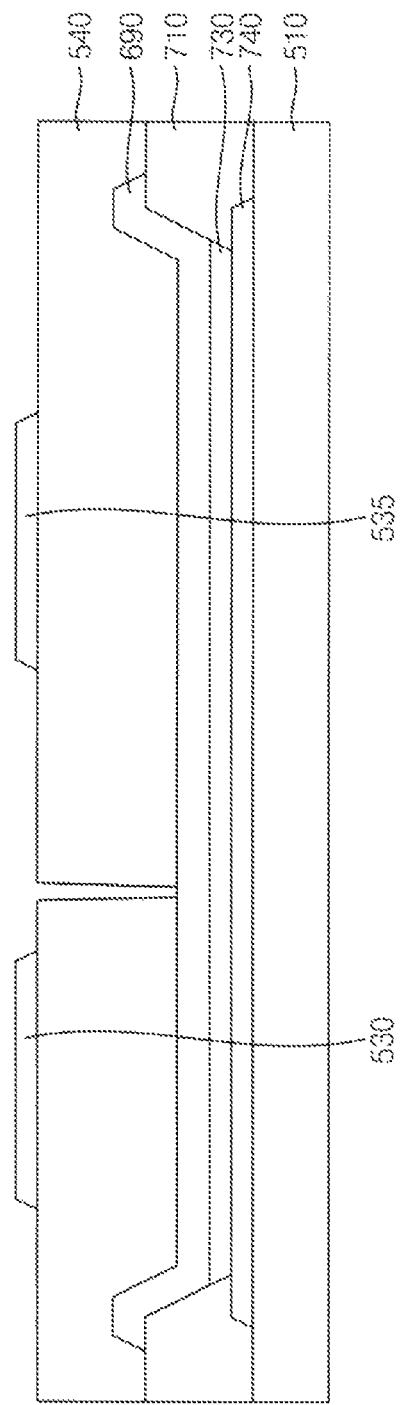

Referring to FIG. 4, a planarization layer 540 may be formed on the second electrode 690 and the first pixel defining layer 710. An upper surface of the planarization layer 540 may have a substantially flat surface. For example, the planarization layer 540 may be formed using inorganic materials or organic materials. The inorganic materials may be formed of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zinc oxide (ZnOx), titanium oxide (TiOx), etc. The organic materials may be formed of polyimide, polyester, acryl, etc. In some example embodiments, the planarization layer 540 may have a stack structure in which the inorganic material and the organic material are alternately stacked.

First and second active patterns 530 and 535 may be formed on the planarization layer 540. The first and second active patterns 530 and 535 may be spaced apart from each other by a predetermined distance on the planarization layer 540. Each of the first and second active patterns 530 and 535 may be formed using an oxide semiconductor, an inorganic semiconductor (e.g., amorphous silicon, polysilicon, etc.), an organic semiconductor, etc. In addition, a first portion of the planarization lay 540 may be removed to expose at least a portion of the second electrode 690.

Figure 5:
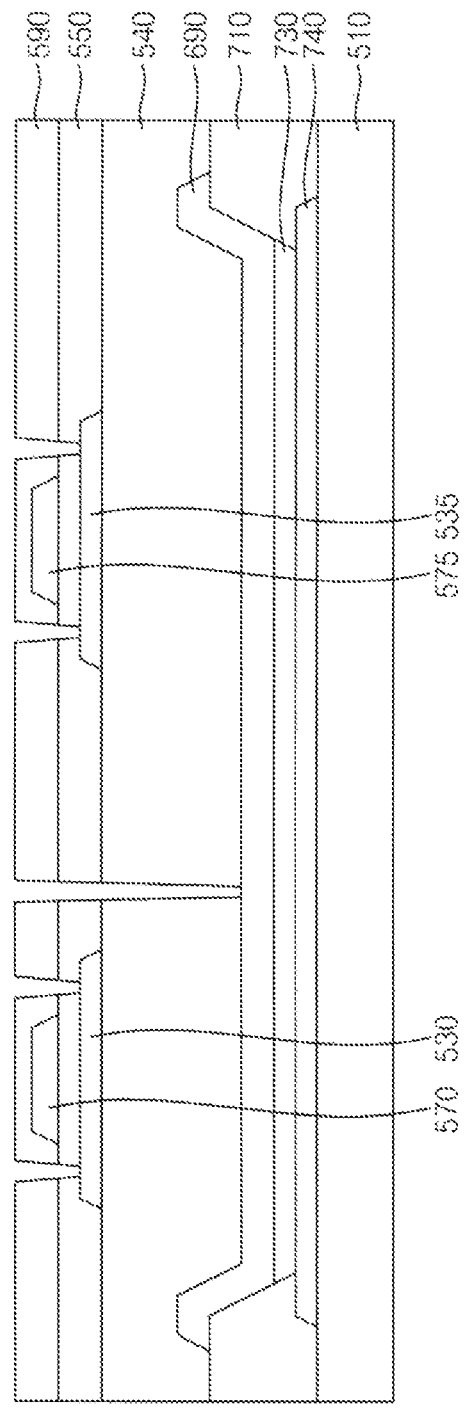

Referring to FIG. 5, a gate insulating layer 550 may be formed on the first and second active patterns 530 and 535. The gate insulating layer 550 may cover the first and second active patterns 530 and 535, and may cover the planarization layer 540. That is, the gate insulating layer 550 may be formed on the entire planarization layer 540. The gate insulating layer 550 may be formed using a silicon compound, a metal oxide, etc.

Each of first and second gate electrodes 570 and 575 may be formed on the first and second active patterns 530 and 535, respectively, to overlap the first and second active patterns 530 and 535. Each of the first and second gate electrodes 570 and 575 may be formed using a metal, a metal alloy, metal nitride, conductive metal oxide, etc.

An insulating interlayer 590 may be formed on the first and second gate electrodes 570 and 575. The insulating interlayer 590 may cover the first and second gate electrodes 570 and 575, and the gate insulating layer 550. That is, the insulating interlayer 590 may be formed on the entire gate insulating layer 550. The insulating interlayer 590 may be formed using a silicon compound, a metal oxide, etc.

In addition, a source region of the first active pattern 530 may be exposed by removing a second portion of the gate insulating layer 550 and the insulating interlayer 590, and a drain region of the first active pattern 530 may be exposed by removing a third portion of the gate insulating layer 550 and the insulating interlayer 590. In similar, a source region of the second active pattern 535 may be exposed by removing a fourth portion of the gate insulating layer 550 and the insulating interlayer 590, and a drain region of the second active pattern 535 may be exposed by removing a fifth portion of the gate insulating layer 550 and the insulating interlayer 590. Further, a portion of the second electrode 690 may be exposed by removing a sixth portion of the gate insulating layer 550 and the insulating interlayer 590.

Figure 6:
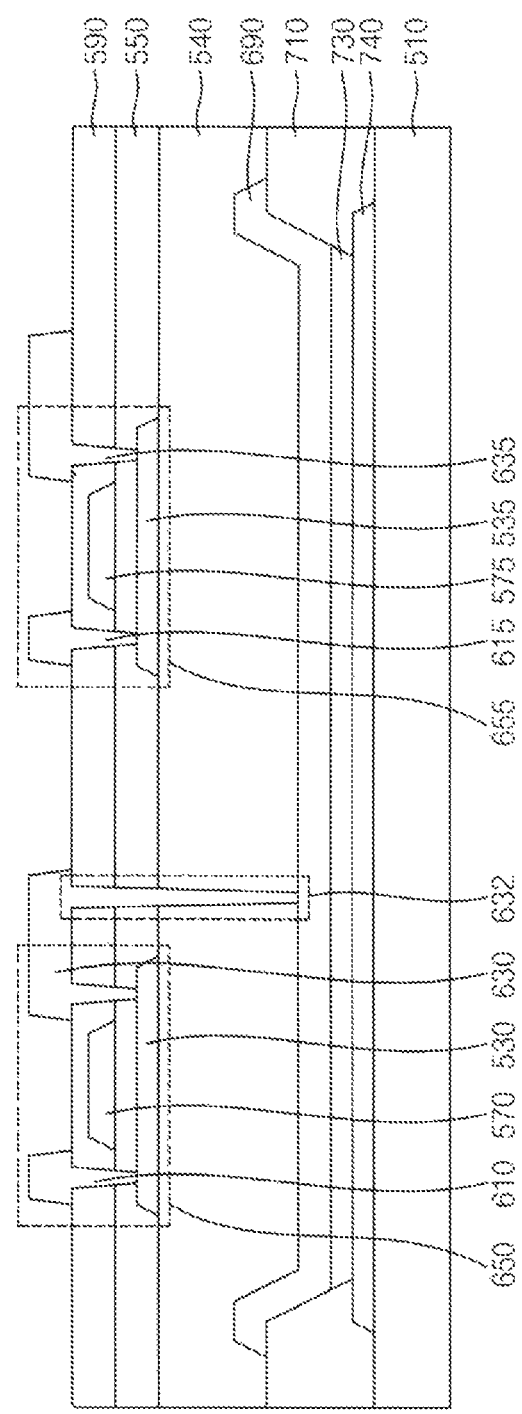

Referring to FIG. 6, first and second source electrodes 610 and 615 and first and second drain electrodes 630 and 635 may be formed on the insulating interlayer 590. The first source electrode 610 may fill the removed second portion of the gate insulating layer 550 and the insulating interlayer 590, may contact the source region of the first active pattern 530, and the second source electrode 615 may fill the removed fourth portion of the gate insulating layer 550 and the insulating interlayer 590, and may contact the source region of the second active pattern 535.

The first drain electrode 630 may have a first extension portion, a second extension portion, and a third extension portion 632. The first extension portion of the first drain electrode 630 may extend on a surface of the insulating interlayer 590. The second extension portion of the first drain electrode 630 may extend from the first extension portion in the second direction that is perpendicular to the upper surface of the first substrate 510. For example, the second extension portion may fill the removed third portion of the gate insulating layer 550 and the insulating interlayer 590, and may contact the drain region of the first active pattern 530. The third extension portion 632 of the first drain electrode 630 may extend from the first extension portion in the second direction. The third extension portion 632 may be spaced apart from the second extension portion. For example, the third extension portion 632 may fill the removed sixth portion of the gate insulating layer 550 and the insulating interlayer 590 and the first portion of the planarization layer 540, and may contact the second electrode 690. That is, the first transistor 650 may be electrically connected to the first light emitting structure via the third extension portion 632.

The second drain electrode 635 may have a fourth extension portion and a fifth extension portion. The fourth extension portion of the second drain electrode 635 may extend on the surface the insulating interlayer 590 in the first direction. The fourth extension portion may contact an extension portion of a third electrode that will be described below. The fifth extension portion of the second drain electrode 635 may extend from the fourth extension portion in the second direction. For example, the fifth extension portion may fill the removed fifth portion of the gate insulating layer 550 and the insulating interlayer 590, and may contact the drain region of the second active pattern 535. That is, the second transistor 655 may be electrically connected to the second light emitting structure via the extension portion of the third electrode. Each of the first and second source electrodes 610 and 615 and each of the first and second drain electrodes 630 and 635 may be formed using a metal, a metal alloy, metal nitride, conductive metal oxide, etc. Thus, a first transistor 650 including the first active pattern 530, the first gate electrode 570, the first source electrode 610, and the first drain electrode 630 may be formed. A second transistor 655 including the second active pattern 535, the second gate electrode 575, the second source electrode 615, and the second drain electrode 635 may be formed.

Figure 7:
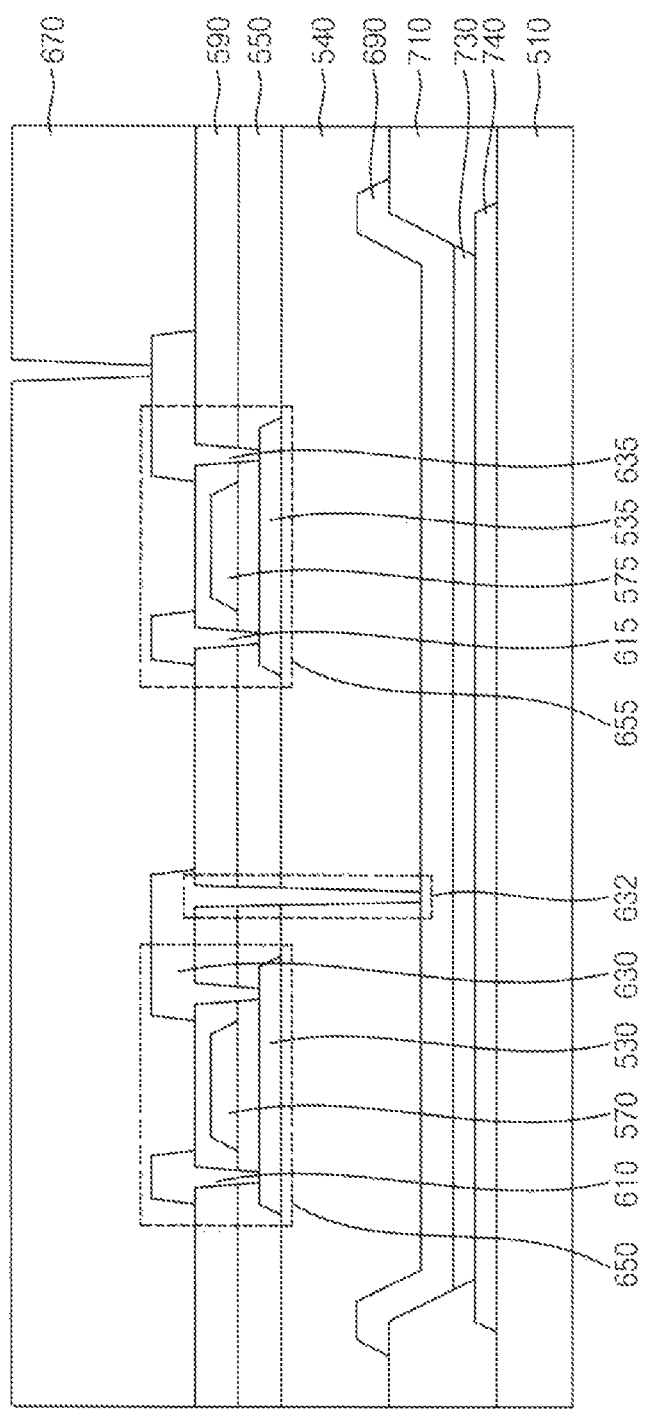

Referring to FIG. 7, a protection layer 670 may be formed on the first and second source electrodes 610 and 615 and the first and second drain electrodes 630 and 635. An upper surface of the protection layer 670 may have a substantially flat surface. The protection layer 670 may cover the first and second source electrodes 610 and 615 and the first and second drain electrodes 630 and 635, and may cover the insulating interlayer 590. That is, the protection layer 670 may be formed on the entire insulating interlayer 590. For example, the protection layer 670 may be formed using inorganic materials such as SiOx, SiNx, SiOxNy, SiOxCy, SiCxNy, AlOx, AlNx, TaOx, HfOx, ZnOx, TiOx, etc. Alternatively, the protection layer 670 may be formed using organic materials such as polyimide, polyester, acryl, etc. In some example embodiments, the protection layer 670 may have a stack structure in which the inorganic material and the organic material are alternately stacked. In addition, at least a portion of the second drain electrode 635 may be exposed by removing a seventh portion of the protection layer 670.

Figure 8:
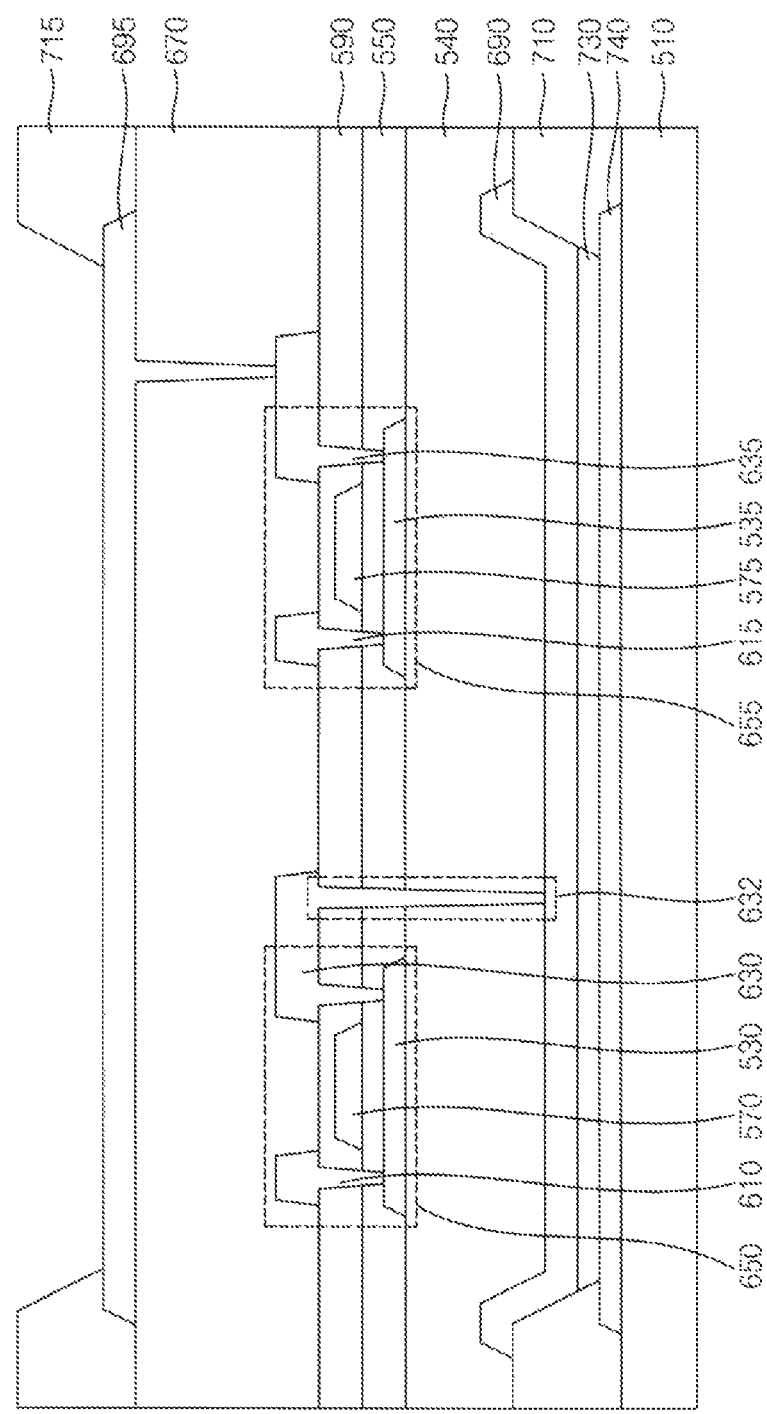

Referring to FIG. 8, a third electrode 695 may be formed on the protection layer 670. A thickness of the third electrode 695 may be formed in at least about 500 angstroms. The third electrode 695 having a thick thickness may reflect a light that is emitted from a second light emitting layer that will be described blow. That is, after the reflected light transmits a fourth electrode that will be described blow, the light may be emitted in an upper surface of the display device. The third electrode 695 may be formed using a metal, a metal alloy, metal nitride, conductive metal oxide, etc. As described above, the extension portion 637 of the third electrode 695 may fill the removed seventh portion of the protection layer 670, and may contact the second drain electrode 635. Accordingly, a second light emitting structure may be electrically connected to the second transistor 655.

A second pixel defining layer 715 may be formed on the protection layer 670 to expose at least a portion of the third electrode 695. For example, the second pixel defining layer 715 may be formed using an organic material, an inorganic material, etc.

Figure 9:
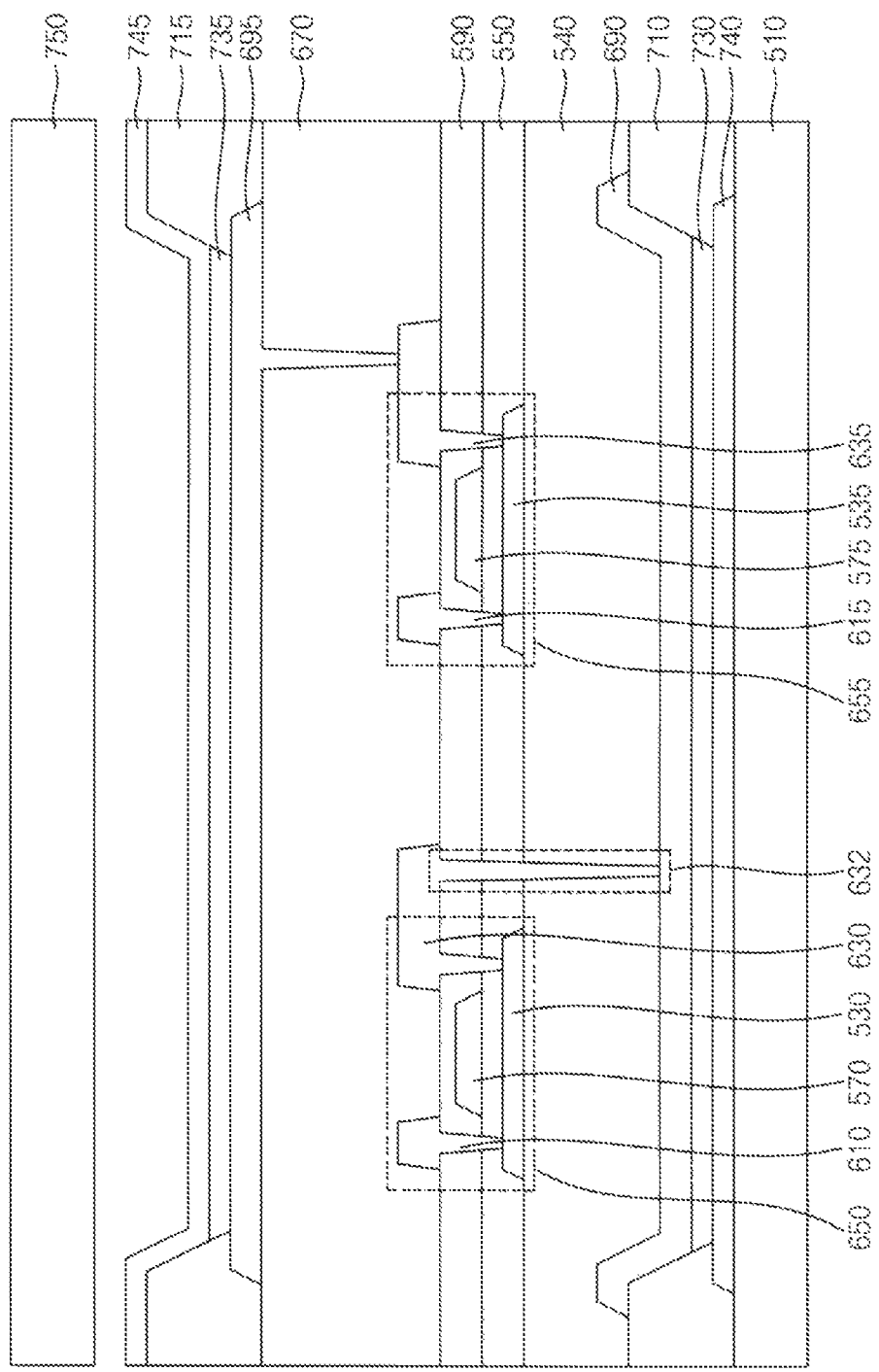

Referring to FIG. 9, a second light emitting layer 735 may be formed on the third electrode 695, and may be surrounded by the second pixel defining layer 715. The second light emitting layer 735 may be formed using at least one of light emitting materials capable of generating different colors of light (e.g., a red color of light, a blue color of light, and a green color of light, etc) according to a configuration of the display device 100.

A fourth electrode 745 may be formed on the second light emitting layer 735 and the second pixel defining layer 715. A thickness of the fourth electrode 745 may be formed in about 100 angstroms. After the light that is emitted from the second light emitting layer 735 transmits the fourth electrode 745 having a thin thickness, the light may be emitted in an upper surface (e.g., the front) of the display device 100. The fourth electrode 745 may be formed using a metal, a metal alloy, metal nitride, conductive metal oxide, transparent conductive materials, etc. Accordingly, the second light emitting structure including the third electrode 695, the second light emitting layer 735, and the fourth electrode 745 may be formed.

A second substrate 750 may be formed on the fourth electrode 745. The second substrate 750 and the first substrate 510 may be formed using substantially the same materials. For example, the second substrate 750 may be formed using quartz, synthetic quartz, calcium fluoride, fluoride-doping quartz, sodalime glass, non-alkali glass etc.

Figure 10:
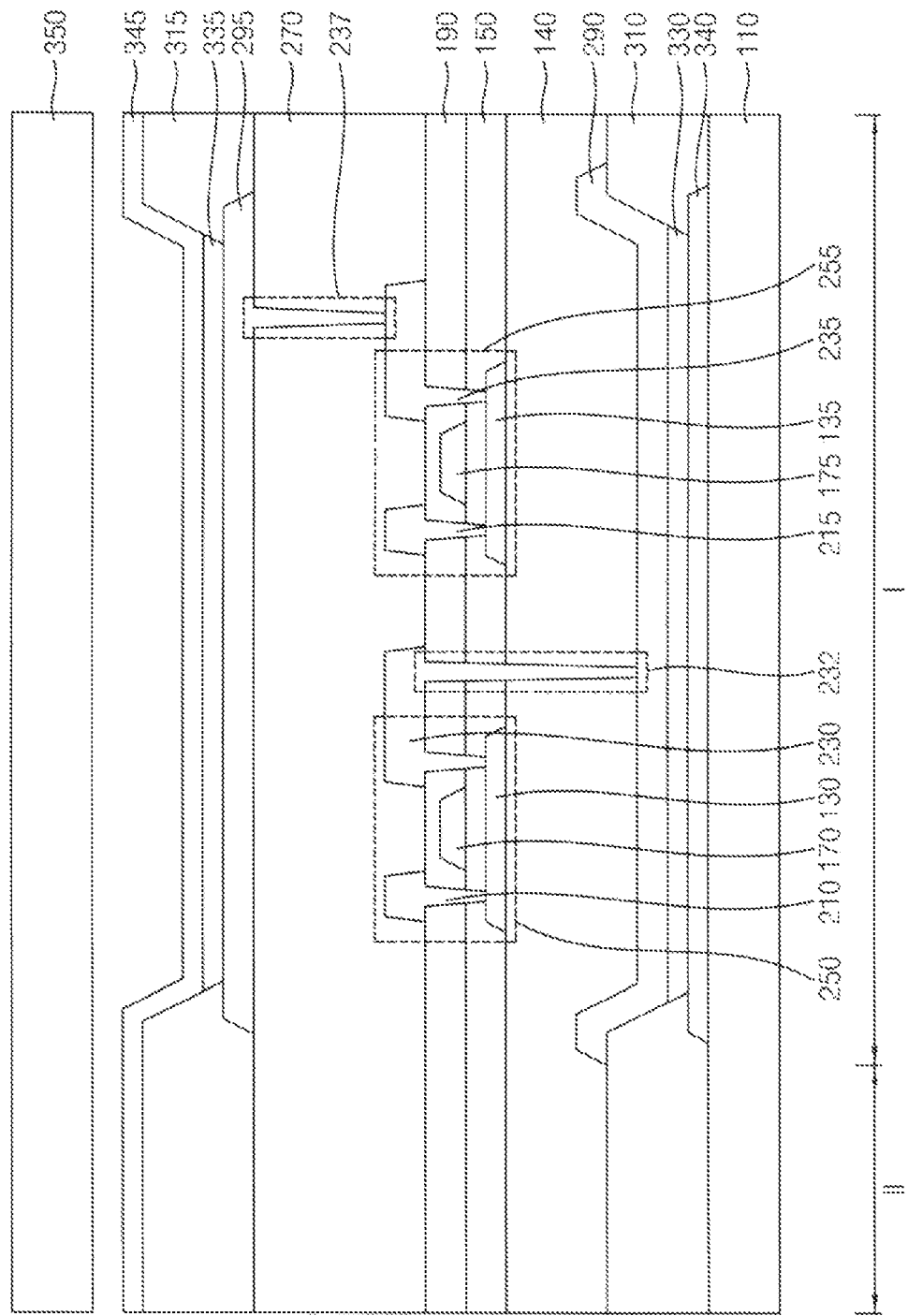
FIG. 10 is a cross-sectional view illustrating a display device in accordance with example embodiments.

FIG. 10 is a cross-sectional view illustrating a display device in accordance with example embodiments. A display device illustrated in FIG. 10 may have a configuration substantially the same as or similar to that of a display device 100 described with reference to FIG. 1 except a display region and a transparent region. In FIG. 10, detailed descriptions for elements, which are substantially the same as or similar to the elements described with reference to FIG. 1, will be omitted.

Referring to FIG. 10, a display device may include a first substrate 110, a first light emitting structure, a first pixel defining layer 310, a planarization layer 140, a gate insulating layer 150, an insulating interlayer 190, a first transistor 250, a second transistor 255, a protection layer 270, a second light emitting structure, a second pixel defining layer 315, a second substrate 350, etc. Here, the first light emitting structure may include a first electrode 340, a first light emitting layer 330, and a second electrode 290. The second light emitting structure may include a third electrode 295, a second light emitting layer 335, and a fourth electrode 345. In addition, each of the first and second transistors 250 and 255 may include first and second active patterns 130 and 135, first and second gate electrodes 170 and 175, first and second source electrodes 210 and 215, and first and second drain electrodes 230 and 235.

The display device may have a display region I and a transparent region II. The first light emitting structure, the second light emitting structure, the first transistor 250, and the second transistor 255 may be disposed in the display region I. In addition, a portion of the first substrate 110, a portion of the first pixel defining layer 310, a portion of the planarization layer 140, a portion of the gate insulating layer 150, a portion of the insulating interlayer 190, a portion of the protection layer 270, a portion of the second pixel defining layer 315, a portion of the fourth electrode 345, and a portion of the second substrate 350 may be located in the transparent region II.

For example, a display image may be displayed in the display region I of the display device, and an image of an object that is located in the rear of the display device may be transmitted through the transparent region II. Thus, as the display device includes the first light emitting layer 330 that is electrically connected to the first transistor 250 and the second light emitting layer 335 that is electrically connected to the second transistor 255, the display device may serve as a double-sided emission display device (e.g., dual display device) capable of simultaneously (e.g., concurrently) emitting light in an upper surface (e.g., the front) and a lower surface (e.g., the rear). In addition, the display device may serve as the double-sided emission display device capable of displaying a different display image in the front and the rear. Further, as the display device includes the transparent region II, the display device may serve as a transparent double-sided emission display device.

As the display device includes the display region I and the transparent region II, the first substrate 110 may separate the display region I and the transparent region II. The first electrode 340 may be disposed in the display region I on the first substrate 110. Alternatively, when the first electrode 340 is disposed in the display region I and the transparent region II on the entire first substrate 110, the first electrode 340 may include transparent materials.

The first pixel defining layer 310 may be disposed on the first substrate 110 to expose at least a portion of the first electrode 340. That is, the first pixel defining layer 310 may be entirely disposed in the display region I and the transparent region II. For example, the first pixel defining layer 310 may include a transparent organic material, a transparent inorganic material, etc.

The first light emitting layer 330 may be disposed on the first electrode 340, and may be surrounded by the first pixel defining layer 310.

The second electrode 290 may be disposed on the first light emitting layer 330 and a portion of the first pixel defining layer 310. That is, the second electrode 290 may not be disposed in the transparent region II. Accordingly, the first light emitting structure including the first electrode 340, the first light emitting layer 330, and the second electrode 290 may be disposed in the display region I.

The planarization layer 140 may be disposed on the second electrode 290 and the first pixel defining layer 310. That is, the planarization layer 140 may be entirely disposed in the display region I and the transparent region II. For example, the planarization layer 140 may include transparent inorganic materials or transparent organic materials.

The first transistor 250 and the second transistor 255 may be disposed in the display region I on the planarization layer 140. The first and second active patterns 130 and 135 may be spaced apart from each other by a predetermined distance on the planarization layer 140.

The gate insulating layer 150 may be disposed on the first and second active patterns 130 and 135. The gate insulating layer 150 may cover the first and second active patterns 130 and 135, and the planarization layer 140. That is, the gate insulating layer 150 may be entirely disposed on in the display region I and the transparent region II. The gate insulating layer 150 may include a transparent silicon compound, a transparent metal oxide, etc.

Each of the first and second gate electrodes 170 and 175 may be disposed on each of portions under which each of the first and second active patterns 130 and 135 is located.

The insulating interlayer 190 may be disposed on the first and second gate electrodes 170 and 175. The insulating interlayer 190 may cover the first and second gate electrodes 170 and 175, and the gate insulating layer 150. That is, the insulating interlayer 190 may be entirely disposed in the display region I and the transparent region II. The insulating interlayer 190 may include a transparent silicon compound, a transparent metal oxide, etc.

The first and second source electrodes 210 and 215 and the first and second drain electrodes 230 and 235 may be disposed on the insulating interlayer 190. The first transistor 250 may be electrically connected to the first light emitting structure via the third extension portion 232.

The protection layer 270 may be disposed on the first and second source electrodes 210 and 215 and the first and second drain electrodes 230 and 235. The protection layer 270 may cover the first and second source electrodes 210 and 215 and the first and second drain electrodes 230 and 235, and may cover the insulating interlayer 190. That is, the protection layer 270 may be entirely disposed in the display region I and the transparent region II. For example, the protection layer 270 may include transparent inorganic materials and transparent organic materials.

The third electrode 295 may be disposed in the display region I on the protection layer 270. The extension portion 237 of the third electrode 295 may contact the second drain electrode 235 through a contact hole formed through a portion of the protection layer 270, and the second light emitting structure may be electrically connected to the second transistor 255.

The second pixel defining layer 315 may be disposed on the protection layer 270 to expose at least a portion of the third electrode 295. That is, the second pixel defining layer 315 may be entirely disposed in the display region I and the transparent region II. For example, the second pixel defining layer 315 may be formed of a transparent organic material, a transparent inorganic material, etc.

The second light emitting layer 335 may be disposed on the third electrode 295, and may be surrounded by the second pixel defining layer 315.

The fourth electrode 345 may be disposed on the second light emitting layer 335 and the second pixel defining layer 315. Alternatively, when the fourth electrode 345 is entirely disposed in the display region I and the transparent region II, the fourth electrode 345 may include transparent materials.

The second substrate 350 may be disposed on the fourth electrode 345. The second substrate 350 and the first substrate 110 may include substantially the same materials.

As the display device in accordance with example embodiments has the transparent region II, the display device may serve as the transparent double-sided emission display device.

The present invention may be applied to various display devices including a display device. For example, the present invention may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device, comprising:
a first substrate;
a first light emitting structure on the first substrate;
a first transistor on the first light emitting structure, the first transistor electrically connected to the first light emitting structure;
a second transistor disposed on the same level with the first transistor;
a second light emitting structure on the first and second transistors, the second light emitting structure electrically connected to the second transistor; and
a second substrate on the second light emitting structure, the second substrate opposite to the first substrate.

2. The display device of claim 1, wherein the first light emitting structure includes:
a first electrode on the first substrate;
a first light emitting layer on the first electrode; and
a second electrode on the first light emitting layer.

3. The display device of claim 2, further comprising:
a first pixel defining layer exposing a portion of the first electrode, the first pixel defining layer electrically insulating the first and second electrodes.

4. The display device of claim 2, wherein the first light emitting layer includes at least one selected from a small molecule organic light emitting layer, a polymer organic light emitting layer, an inorganic light emitting layer.

5. The display device of claim 2, wherein light that is emitted from the first light emitting layer is reflected from the second electrode and transmits the first electrode.

6. The display device of claim 1, wherein the second light emitting structure includes:
a third electrode on the first and second transistors;
a second light emitting layer on the third electrode; and
a fourth electrode on the second light emitting layer.

7. The display device of claim 6, further comprising:
a protection layer on the first and second transistors, wherein the third electrode contacts to the second transistor through a contact hole formed in a portion of the protection layer.

8. The display device of claim 6, further comprising:
a second pixel defining layer exposing a portion of the third electrode, the second pixel defining layer electrically insulating the third and fourth electrodes.

9. The display device of claim 6 wherein light that is emitted from the second light emitting layer is reflected from the third electrode and transmits the fourth electrode.

10. The display device of claim 1, wherein the first transistor includes:
a first active pattern on the first light emitting structure;
a first gate electrode on the first active pattern;
a first source electrode electrically connected to a source region of the first active pattern; and
a first drain electrode electrically connected to a drain region of the first active pattern and the first light emitting structure.

11. The display device of claim 10, wherein the second transistor includes:
a second active pattern disposed on the same level with the first active pattern, the second active pattern spaced apart from the first active pattern;
a second gate electrode disposed on the same level with the first gate electrode, the second gate electrode spaced apart from the first gate electrode;
a second source electrode electrically connected to a source region of the second active pattern; and
a second drain electrode electrically connected to a drain region of the second active pattern and the second light emitting structure.

12. The display device of claim 11, further comprising:
a planarization layer between the first light emitting structure and the first and second transistors;
a gate insulating layer covering the first and second active patterns on the planarization layer; and
an insulating interlayer covering the first and second gate electrodes on the gate insulating layer.

13. The display device of claim 12, wherein the first drain electrode includes:
a first extension portion covering a surface of the insulating interlayer;
a second extension portion extending from the first extension portion in a direction that is perpendicular to the upper surface of the first substrate, the second extension portion contacting the drain region of the first active pattern through a contact hole formed in a portion of the gate insulating layer and a portion of the insulating interlayer; and a third extension portion spaced apart from the second extension portion, the third extension portion extending from the first extension portion in a direction that is perpendicular to the upper surface of the first substrate, the third extension portion contacting the first light emitting structure through a contact hole formed in a portion of the gate insulating layer, a portion of the insulating interlayer and a portion of the first planarization layer.

14. The display device of claim 12, wherein the second drain electrode includes:

a fourth extension portion covering a surface of the insulating interlayer; and a fifth extension portion extending from the fourth extension portion in a direction that is perpendicular to the upper surface of the first substrate, the fifth extension portion contacting the drain region of the second active pattern through a contact hole formed in a portion of the gate insulating layer and a portion of the insulating interlayer.

15. The display device of claim 12, wherein the first source electrode contacts the source region of the first active pattern through a contact hole formed in a portion of the gate insulating layer and a portion of the insulating interlayer, and wherein the second source electrode contacts the source region of the second active through a contact hole formed in a portion of the gate insulating layer and a portion of the insulating interlayer.

16. The display device of claim 1, wherein the first light emitting structure displays a first display image in a first direction that is perpendicular to an upper surface of the first substrate, and wherein the second light emitting structure displays a second display image in a second direction that is opposite to the first direction.

17. The display device of claim 16, wherein the first display image is the same as the second display image.

18. The display device of claim 16, wherein the first display image is different from the second display image.

19. The display device of claim 1, wherein, the first substrate has a display region and a transparent region.

20. The display device of claim 19, wherein the first light emitting structure, a second light emitting structure, a first transistor, and a second transistor are disposed in the display region, and an image of an object that is located in the rear of the display device is transmitted through the transparent region.

* * * * *